US012618169B2

(12) United States Patent
Kim et al.

(10) Patent No.: US 12,618,169 B2
(45) Date of Patent: May 5, 2026

---

(54) INGOT GROWING APPARATUS

(71) Applicants: HANWHA SOLUTIONS CORPORATION, Seoul (KR); HANWHA CORPORATION, Seoul (KR)

(72) Inventors: Keun Ho Kim, Seoul (KR); Kyung Seok Lee, Seoul (KR); Jin Sung Park, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 434 days.

(21) Appl. No.: 18/028,605

(22) PCT Filed: Sep. 3, 2021

(86) PCT No.: PCT/KR2021/011959
§ 371 (c)(1),
(2) Date: Aug. 29, 2023

(87) PCT Pub. No.: WO2022/065743
PCT Pub. Date: Mar. 31, 2022

(65) Prior Publication Data
US 2024/0003045 A1      Jan. 4, 2024

(30) Foreign Application Priority Data
Sep. 28, 2020    (KR) ........................ 10-2020-0126316

(51) Int. Cl.
C30B 15/10      (2006.01)
C30B 15/02      (2006.01)
C30B 29/06      (2006.01)

(52) U.S. Cl.
CPC .............. C30B 15/10 (2013.01); C30B 15/02 (2013.01); C30B 29/06 (2013.01)

(58) Field of Classification Search
CPC ......... C30B 15/02; C30B 29/06; C30B 15/10; C30B 15/12; C30B 15/30; Y10T 117/10
See application file for complete search history.

(56) References Cited

U.S. PATENT DOCUMENTS

| | | | | |
|---|---|---|---|---|
| 2008/0053372 A1* | 3/2008 | Anttila | .................... | C30B 29/20 |
| | | | | 117/200 |
| 2010/0180815 A1* | 7/2010 | Sato | ........................ | C30B 15/10 |
| | | | | 117/213 |
| 2013/0220215 A1* | 8/2013 | Eidelman | .............. | C30B 15/002 |
| | | | | 117/214 |

FOREIGN PATENT DOCUMENTS

| | | |
|---|---|---|
| CN | 103668438 A | 3/2014 |
| CN | 204803434 U | 11/2015 |

(Continued)

OTHER PUBLICATIONS

Office Action issued Nov. 30, 2024 in Chinese Patent Application No. 202011414600.4.

(Continued)

*Primary Examiner* — Hua Qi
(74) *Attorney, Agent, or Firm* — Sughrue Mion, PLLC

(57)      ABSTRACT

An ingot growing apparatus is disclosed. An ingot growing apparatus according to an aspect of the present invention comprises a growth furnace for growing an ingot, and a main crucible which is accommodated in the growth furnace and accommodates molten silicon, wherein the main crucible comprises: a main crucible bottom portion; a main crucible side portion that extends upwardly from the main crucible bottom portion; and a main crucible inclined portion that has an inclined surface extending upward and outward from the main crucible side portion. In addition, when the molten (Continued)

silicon is supplied from the upper side of the main crucible side portion into the main crucible, the molten silicon is guided into the main crucible along the inclined surface, thereby preventing the molten silicon from splashing around the main crucible.

10 Claims, 9 Drawing Sheets

(56) References Cited

FOREIGN PATENT DOCUMENTS

| | | | |
|---|---|---|---|
| CN | 207326174 U | | 5/2018 |
| CN | 209759310 U | | 12/2019 |
| CN | 210547936 U | * | 5/2020 |
| CN | 214300465 U | | 9/2021 |
| JP | 2002-060296 A | | 2/2002 |
| JP | 2003201197 A | * | 7/2003 |
| JP | 4800292 B2 | | 10/2011 |
| JP | 2015-137210 A | | 7/2015 |
| JP | 6264058 B2 | | 1/2018 |
| KR | 10-1311293 B1 | | 9/2013 |
| KR | 10-2271706 B1 | | 7/2021 |

OTHER PUBLICATIONS

International Search Report for PCT/KR2021/011959 dated Dec. 15, 2021.

Communication dated Aug. 7, 2025 in Chinese Application No. 202011414600.4.

Communication dated Oct. 3, 2025 in Indian Application No. 202317029700.

* cited by examiner

【FIG. 1】
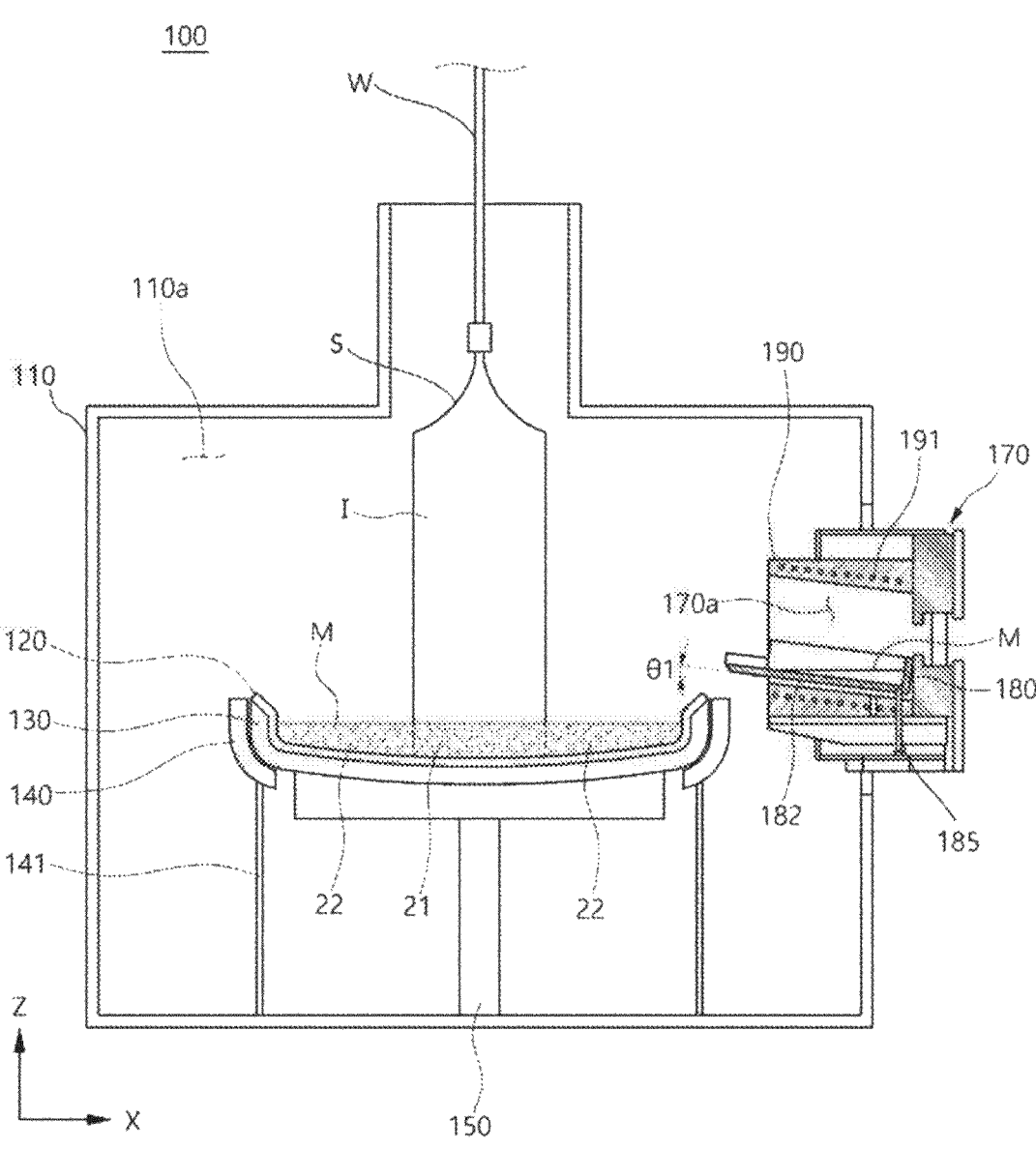

【FIG. 2a】
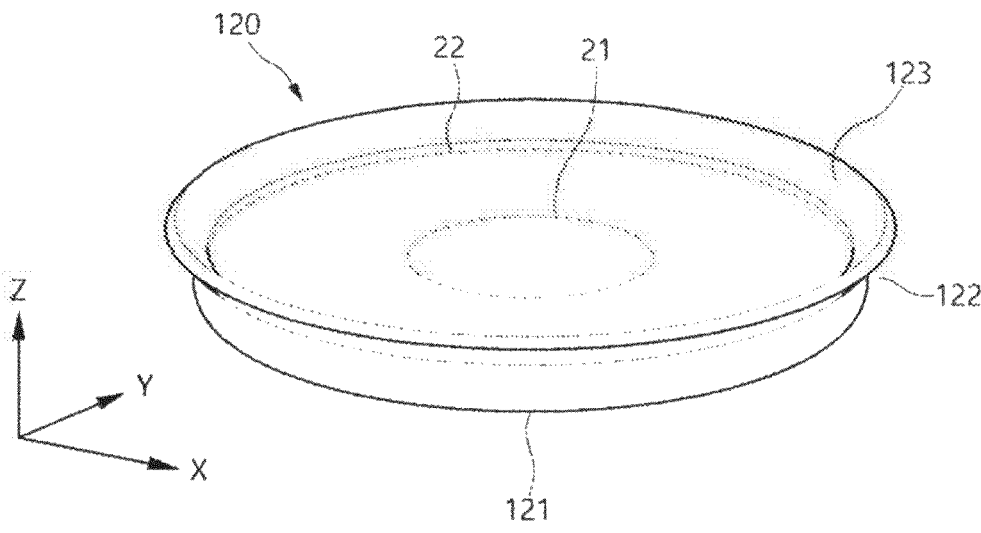

【FIG. 2b】
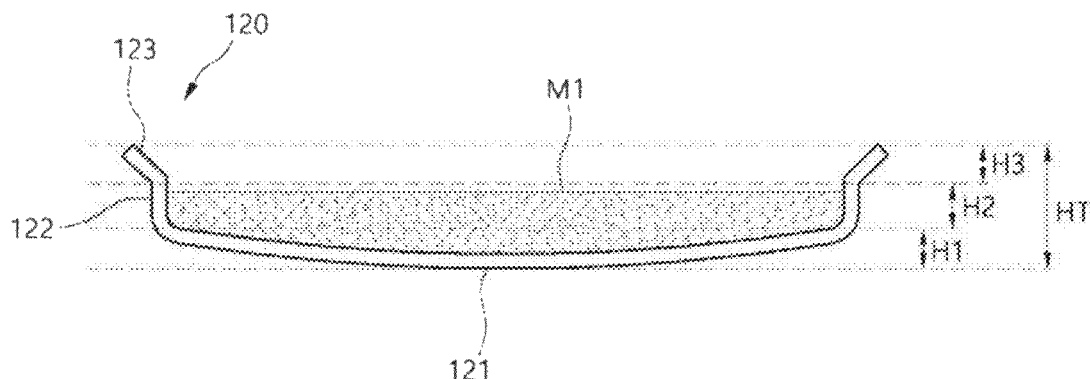

【FIG. 3】
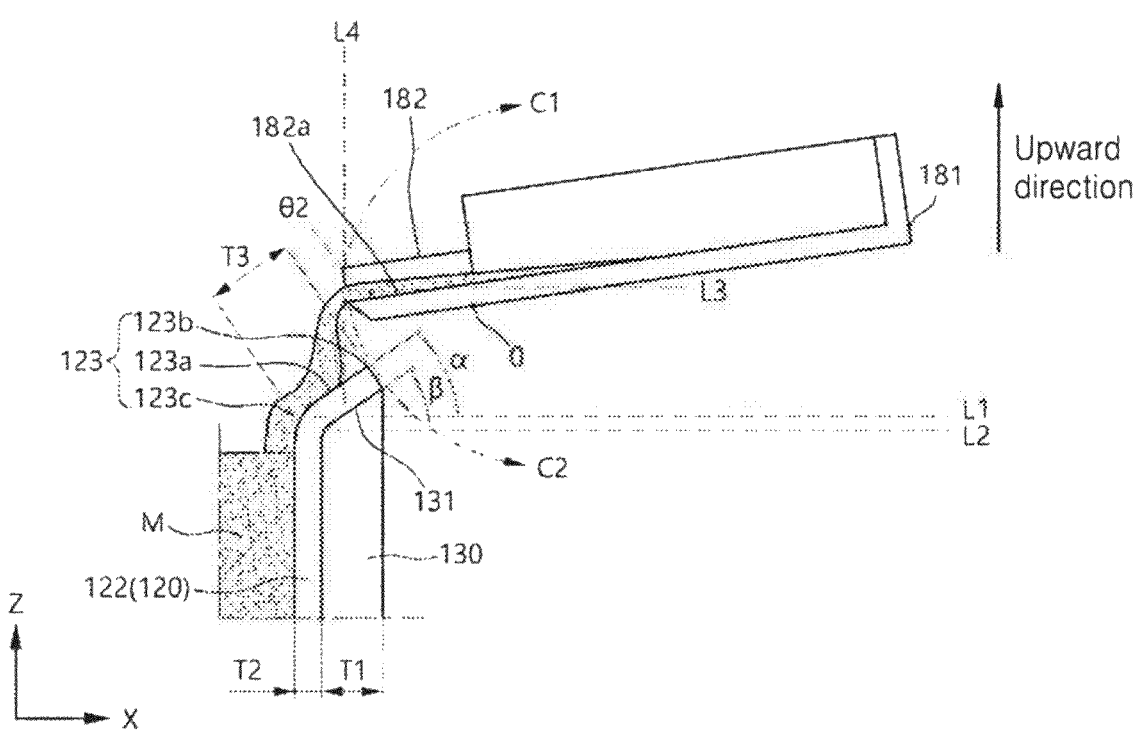

【FIG. 4】
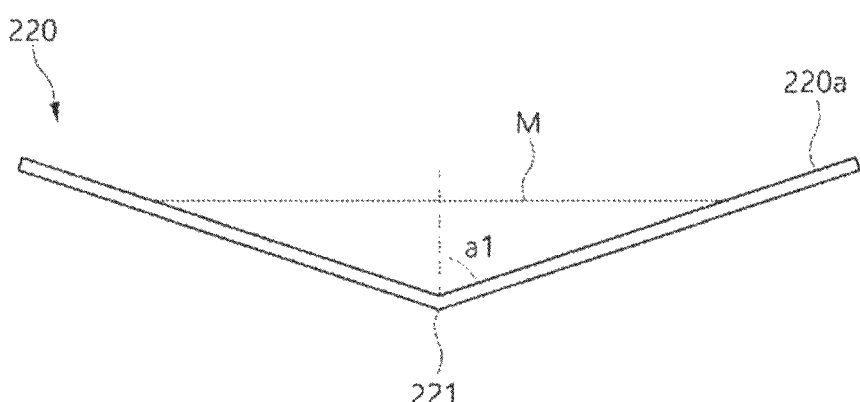

【FIG. 5】
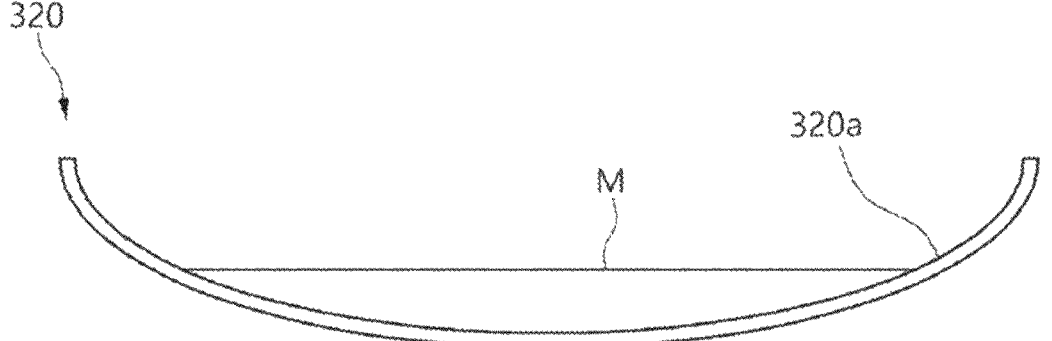

【FIG. 6】
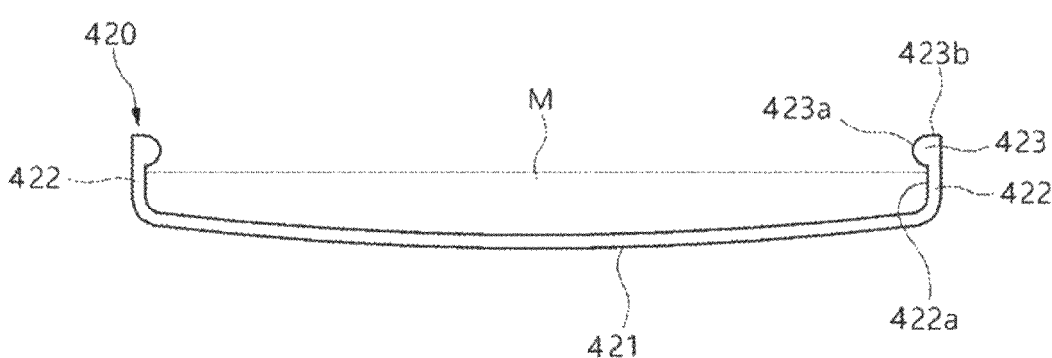

【FIG. 7】
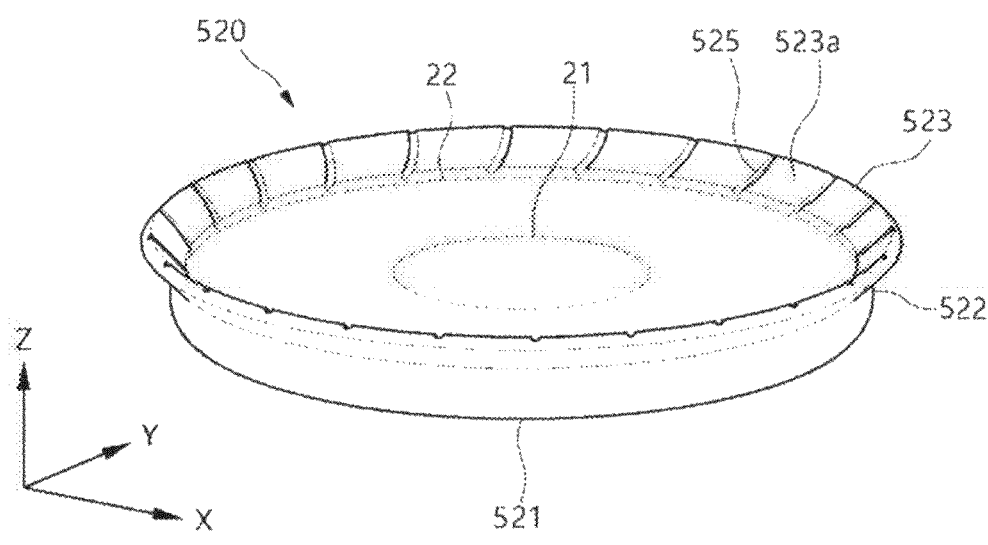

[FIG. 8]
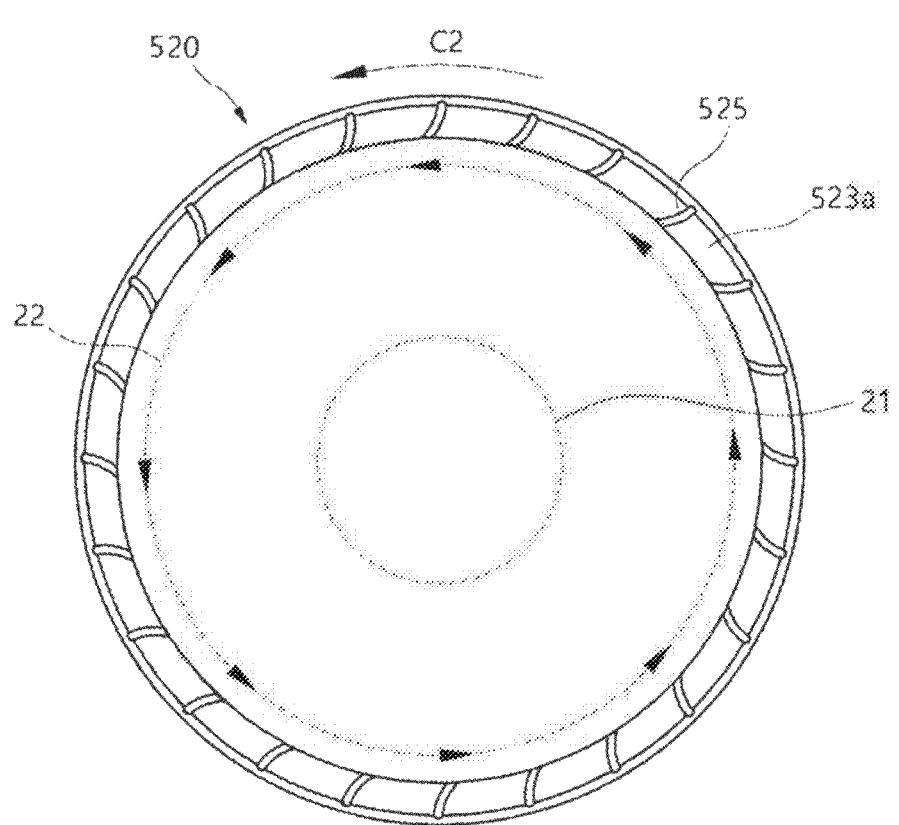

INGOT GROWING APPARATUS

CROSS-REFERENCE TO RELATED APPLICATION

This application is a National Stage of International Application No. PCT/KR2021/011959 filed Sep. 3, 2021, claiming priority based on Korean Patent Application No. 10-2020-0126316 filed Sep. 28, 2020.

TECHNICAL FIELD

The present invention relates to an apparatus for growing an ingot.

BACKGROUND ART

Single crystal silicon is used as a basic material for most semiconductor components, and this material is manufactured as single crystals with high purity, and one of the manufacturing methods thereof is the Czochralski method.

In the Czochralski crystallization method, silicon is placed into a crucible, and the crucible is heated to melt the silicon. In addition, when a single crystal seed is pulled upward while rotating in a state of being in contact with the molten silicon, an ingot having a predetermined diameter is grown.

The continuous Czochralski method (CCz), which is one of the Czochralski methods, is a method of continuously growing an ingot while supplementing the consumed molten silicon by continuously injecting solid polysilicon or molten silicon into the crucible.

While solid polysilicon is injected into the crucible, a phenomenon occurs in which molten silicon is splashed. In addition, when the molten silicon is splashed, a wave is generated in the molten silicon, and there is a problem in that the single crystal yield of an ingot is lowered.

Further, in the process of injecting solid polysilicon into the crucible, a sudden temperature change of the molten silicon occurs. Such a temperature change is a factor that reduces the single crystal yield of an ingot.

DISCLOSURE

Technical Problem

According to an aspect of the present invention, in the process of supplying a solid silicon material to a crucible, the present invention is directed to providing an apparatus for growing an ingot that prevents a sudden change in temperature of the molten silicon inside the crucible while preventing wave generation in the molten silicon inside the crucible.

Technical Solution

The apparatus for growing an ingot according to an aspect of the present invention may include a growth furnace for growing an ingot; and a main crucible which is accommodated in the growth furnace and accommodates molten silicon, wherein the main crucible includes a main crucible bottom portion; a main crucible side portion which extends upwardly from the main crucible bottom portion; and a main crucible inclined portion that has an inclined surface extending upward and outward from the main crucible side portion, and wherein when the molten silicon is supplied from the upper side of the main crucible side portion into the main crucible, the molten silicon is guided into the main crucible along the inclined surface.

In this case, the inclined surface may be formed such that the slope of the inclined surface is the same from the inside to the outside of the main crucible, or the slope becomes small from the inside to the outside.

In this case, the main crucible side portion may be formed perpendicularly or inclined outward from the main crucible bottom portion.

In this case, a connecting portion where the inclined surface is connected to the main crucible side portion may be formed as a curved surface.

In this case, the main crucible inclined portion may include a guide groove which is formed on the inclined surface and guides the molten silicon supplied onto the inclined surface.

In this case, the guide groove may be formed in plurality on the inclined surface along the circumferential direction of the main crucible.

In this case, the guide groove may be formed in a spiral which is curved from the inside to the outside on the inclined surface.

In this case, the apparatus for growing an ingot may further include a susceptor which is formed to surround the outer surfaces of the main crucible bottom portion, the main crucible side portion and the main crucible inclined portion; and a heater which is located outside the susceptor to heat the main crucible by heating the susceptor.

In this case, the apparatus for growing an ingot may further include a preliminary crucible for melting a solid silicon material to produce the molten silicon and supplying the molten silicon to the main crucible, wherein the preliminary crucible includes a melting part in which the solid silicon material is melted; and a protrusion part which is provided with a guide surface which extends from the melting part in a direction of the main crucible to guide the molten silicon in a direction of the main crucible such that the silicon melted from the melting part can be supplied into the main crucible along the inclined surface of the main crucible, and wherein the preliminary crucible is movable so as to be located at a first position in which the solid silicon material is melted and at a second position in which the molten silicon is supplied to the main crucible.

In this case, in the first position, the guide surface may be formed to be inclined in the upper direction of the main crucible.

In this case, in the second position, the angle between the guide surface and the main crucible bottom portion may be smaller than the angle between the inclined surface and the main crucible bottom portion.

In this case, in the second position, the end of the protrusion part may be positioned adjacent to the inclined surface, and in the first position, the end of the protrusion part may be positioned farther from the inclined surface than in the second position.

Advantageous Effects

According to the above configuration, in the apparatus for growing an ingot according to an aspect of the present invention, when molten silicon is supplied into the main crucible, the molten silicon is guided into the main crucible along the inclined surface, thereby preventing the molten silicon from splashing around the main crucible.

Further, in the apparatus for growing an ingot according to an aspect of the present invention, since the molten silicon is not directly supplied to the main crucible but is supplied to the main crucible through an inclined surface, wave generation in the molten silicon inside the crucible is prevented, and a rapid temperature change of the molten silicon in the main crucible is prevented.

Further, in the apparatus for growing an ingot according to an aspect of the present invention, since the rapid temperature change of the molten silicon inside the main crucible is prevented while preventing the wave generation in the molten silicon inside the crucible inside the main crucible, it prevents the lowering of the single crystal yield of an ingot.

DESCRIPTION OF DRAWINGS

FIG. 1 is a view schematically showing the apparatus for growing an ingot according to an exemplary embodiment of the present invention.

FIG. 2*a* is a perspective view showing a main crucible of the apparatus for growing an ingot according to an exemplary embodiment of the present invention.

FIG. 2*b* is a cross-sectional view showing a main crucible of the apparatus for growing an ingot according to an exemplary embodiment of the present invention.

FIG. 3 is a view showing the main configuration adjacent to the inclined surface of the main crucible of the apparatus for growing an ingot according to an exemplary embodiment of the present invention.

FIG. 4 is a view showing a main crucible of the apparatus for growing an ingot according to another exemplary embodiment of the present invention.

FIG. 5 is a view showing a main crucible of the apparatus for growing an ingot according to another exemplary embodiment of the present invention.

FIG. 6 is a view showing a main crucible of the apparatus for growing an ingot according to another exemplary embodiment of the present invention.

FIG. 7 is a perspective view showing a main crucible of the apparatus for growing an ingot according to another exemplary embodiment of the present invention.

FIG. 8 is a view of the main crucible of FIG. 7 viewed from the upper side of the main crucible.

100. Apparatus for growing ingot
110: Growth furnace
120: Main crucible
121: Main crucible bottom portion
122: Main crucible side portion
123: Main crucible inclined portion
123*a*: Inclined surface

MODES OF THE INVENTION

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the exemplary embodiments described in the present specification and the configurations shown in the drawings correspond to preferred exemplary embodiments of the present invention, and do not represent all the technical spirit of the present invention, and thus, the configurations may have various examples of equivalent and modification that can replace them at the time of filing the present invention.

It is understood that the terms "include" or "have", when used in the present specification, are intended to describe the presence of stated features, integers, steps, operations, elements, components and/or a combination thereof but do not preclude the possibility of the presence or addition of one or more other features, integers, steps, operations, elements, components or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, the apparatus for growing an ingot according to an exemplary embodiment of the present invention will be described with reference to the drawings. In the present specification, in terms of describing the apparatus for growing an ingot according to an exemplary embodiment of the present invention, the configurations that are not related to the contents of the present invention are not illustrated in detail or omitted for the sake of simplification of the drawings, and the apparatus for growing an ingot according to the present invention will be described by mainly focusing on the contents that are related to the spirit of the invention.

In the present specification, the arrow direction of the Z-axis is referred to as the upper side. The lower side means the opposite direction to the upper side.

FIG. 1 is a view schematically showing the apparatus for growing an ingot according to an exemplary embodiment of the present invention.

Referring to FIG. 1, the apparatus 100 for growing an ingot according to an exemplary embodiment of the present invention includes a growth furnace 110, a main crucible 120, a susceptor 130 and a preliminary melting part 170.

The growth furnace 110 has an internal space 110*a* which is maintained in a vacuum state, and is formed such that an ingot I is grown in the internal space 110*a*. The main crucible 120 to be described below is disposed in the inner space 110*a*.

The growth furnace 110 is provided with a vacuum pump (not illustrated) and an inert gas supply part (not illustrated). The vacuum pump may maintain the internal space 110*a* in a vacuum atmosphere. In addition, the inert gas supply part supplies inert gas to the inner space 110*a*. The inert gas may be, for example, argon (Ar).

The main crucible 120 is accommodated in the inner space 110*a* of the growth furnace 110. The main crucible 120 may accommodate molten silicon M. The main crucible 120 is generally formed in the shape of a reverse dome. In addition, the main crucible 120 is not limited to being formed in the shape of a reverse dome, and may be formed in various shapes such as a cylindrical shape.

In addition, the main crucible 120 is made of a quartz material. However, the main crucible 120 is not limited to being made of a quartz material, and may include various materials that have heat resistance at a temperature of about 1,400° C. or higher and withstand a sudden change in temperature.

In addition, while a single crystal seed S is in contact with the molten silicon M accommodated in the main crucible 120, when a wire W connected to the upper side of the growth furnace 110 pulls up the single crystal seed S in the upward direction, the ingot I having a predetermined diameter is grown.

In addition, the inside of the main crucible 120 is divided into a first region 21 in which the ingot I is grown and a second region 22 which surrounds the first region 21. In the first region 21, the temperature for growing the ingot I may be appropriately controlled. The main crucible 120 will be described in detail below with reference to the drawings.

The susceptor 130 surrounds the outer surface of the main crucible 120. The susceptor 130 supports the main crucible 120. The inner surface of the susceptor 130 has a shape corresponding to the outer surface of the main crucible 120. For example, if the main crucible 120 has a reverse dome shape, the susceptor 130 also has a reverse dome shape. The susceptor 130 is made of a graphite material. In addition, the susceptor 130 is not limited to being made of a graphite material, and may include various materials having strong heat resistance and conductor properties.

Accordingly, even if the main crucible 120 is made of a quartz material and deformed at a high temperature, the susceptor 130 surrounds and supports the main crucible 120 so as to maintain a state in which the main crucible 120 accommodates the molten silicon M. In addition, the main crucible 120 which is made of the quartz material blocks a contact between the molten silicon M and the susceptor 130 which is made of the graphite material such that that the graphite is prevented from becoming an impurity of the molten silicon M.

In addition, a susceptor support part 150 for supporting the susceptor 130 is disposed below the growth furnace 110. The upper end of the susceptor support part 150 has a shape corresponding to the lower end of the susceptor 130. In addition, while the susceptor support part 150 supports the susceptor 130 at the lower side of the growth furnace 110, the susceptor support part 150 rotates in the same direction as the susceptor 130. Accordingly, while the main crucible 120 accommodates the molten silicon M, the main crucible 120 is rotated in the same direction as the susceptor 130.

In addition, the growth furnace 110 is provided with a driving part (not illustrated) that provides a rotational force to rotate the susceptor support part 150. The susceptor support part 150 is rotatably connected to the driving part. When the driving part receives power and provides a rotational force to the susceptor support unit 150, the main crucible 120 is rotated in the same direction as the susceptor 130.

In addition, a heater 140 for heating the susceptor 130 is provided in the growth furnace 110. The heater 140 is formed to surround the outer surface of the susceptor 130. The heater 140 may heat the susceptor 130 in a resistance heating method. In addition, the heater 140 may heat the susceptor 130 by electromagnetic induction, which is an induction heating method. When the heater 140 is operated by an induction heating method, the heater 140 is disposed to be spaced apart from the outer surface of the susceptor 130 such that the heat of the susceptor 130 is prevented from being transferred back to the heater 140.

In addition, a heater support part 141 for supporting the heater 140 is disposed below the growth furnace 110. The heater support part 141 is generally formed in a cylindrical shape. The susceptor support part 150 is disposed inside the heater support part 141 having the cylindrical shape. In addition, the upper end of the heater support part 141 has a shape corresponding to the lower end of the heater 140, and the heater 140 is disposed on the upper end of the heater support part 141.

The preliminary melting part 170 is disposed on one side of the growth furnace 110. A heating space 170a is formed in the preliminary melting part 170. In addition, a solid silicon material is melted in the heating space 170a. The preliminary melting part 170 includes a preliminary crucible 180, a preliminary crucible heater 191 and the preliminary crucible moving module 185.

The preliminary crucible 180 is disposed in the heating space 170a. The preliminary crucible 180 is supplied with a solid silicon material. In addition, the preliminary crucible 180 melts the solid silicon material, and accommodates the molten silicon M. The preliminary crucible 180 is made of a quartz material. In addition, a second susceptor (not illustrated) is disposed on the outer surface of the preliminary crucible 180. The second susceptor supports the preliminary crucible 180. The second susceptor is made of a graphite material.

The preliminary crucible heater 191 heats the second susceptor. The preliminary crucible heater 191 may be a coil. The coil may be made of a copper material, and may include various materials having good electrical conductivity. The preliminary crucible heater 191 may heat the second susceptor in a resistance heating method. In addition, the preliminary crucible heater 191 may heat the second susceptor by electromagnetic induction, which is an induction heating method. When the second susceptor is heated, the heat of the second susceptor is thermally conducted to the preliminary crucible 180. In addition, the preliminary crucible heater 191 is surrounded by a shield 190. When the preliminary crucible heater 191 is operated by an induction heating method, the shield 190 is made of a ceramic material. The shield 190 prevents the preliminary crucible heater 191 which is made of a coil from being exposed to the inner space 110a of the growth furnace 110, thereby preventing an arc discharge from occurring in a vacuum atmosphere.

In addition, the preliminary crucible 180 is inclined to one side to supply the molten silicon to the main crucible 120.

In an exemplary embodiment of the present invention, the side facing the main crucible 120 in the preliminary melting part 170 is referred to as one side, and the opposite side is referred to as the other side.

The position of the preliminary crucible 180 is controlled to any one position of a first position in which the solid silicon material is accommodated and melts the accommodated solid silicon material, and a second position which is inclined such that the molten silicon M is supplied to the main crucible 120. That is, the first position means a position of the preliminary crucible 180 which is located such that the molten silicon M accommodated in the preliminary crucible 180 does not overflow or flow to the outside of the preliminary crucible 180, and the second position means a position of the preliminary crucible 180 which is located such that the molten silicon M accommodated in the preliminary crucible 180 is supplied to the main crucible 120. Herein, the position is not only the horizontal (X-axis) and vertical (Z-axis) positions of the preliminary crucible 180, but also may mean to include an angle between the preliminary crucible 180 and the main crucible bottom portion 121.

To this end, the preliminary melting part 170 is provided with a preliminary crucible moving module 185 for moving the position of the preliminary crucible 180.

The preliminary crucible moving module 185 tilts one side of the preliminary crucible 180 toward the main crucible 120, and the molten silicon M accommodated in the preliminary crucible 180 is supplied to the main crucible 120. Accordingly, when the preliminary crucible 180 is inclined to the second position, the molten silicon M in the preliminary crucible 180 falls to the main crucible 120 through one side of the preliminary crucible 180.

In addition, the growth furnace 110 is provided with a quantitative supply part (not illustrated) for supplying a solid silicon raw material to the main crucible 120. The quantitative supply part (not illustrated) receives the solid silicon raw material from the material supply part (not illustrated) and supplies the same to the preliminary melting part 170.

FIG. 2*a* is a perspective view showing a main crucible of the apparatus for growing an ingot according to an exemplary embodiment of the present invention, FIG. 2*b* is a cross-sectional view showing a main crucible of the apparatus for growing an ingot according to an exemplary embodiment of the present invention, and FIG. 3 is a view showing the main configuration adjacent to the inclined surface of the main crucible of the apparatus for growing an ingot according to an exemplary embodiment of the present invention.

Referring to FIGS. 2*a*, 2*b* and 3, the main crucible 120 includes a main crucible bottom portion 121, a main crucible side portion 122 and a main crucible inclined portion 123.

The main crucible bottom portion 121 is formed in a rounded shape.

The main crucible side portion 122 extends upwardly from the main crucible bottom portion 121. In addition, the main crucible side portion 122 is perpendicular from the main crucible bottom portion 121. In addition, according to various exemplary embodiments of the present invention, the main crucible side portion 122 may be formed to be inclined in an outward direction of the main crucible 120.

The main crucible inclined portion 123 is provided with an inclined surface 123*a* which extends upward from the main crucible side portion 122 and outwardly of the main crucible 120.

In an exemplary embodiment of the present invention, as illustrated in FIG. 3, the inclined surface 123*a* is formed such that the slope of the inclined surface is the same from the inside to the outside of the main crucible 120. As another example, the inclined surface 123*a* may be formed such that the slope of the inclined surface decreases from the inner side to the outer side of the main crucible 120.

Meanwhile, in the present specification, when the main crucible bottom portion 121 is formed in a rounded shape, a surface which is parallel to the X axis in the main crucible bottom portion 121 is defined as a main crucible bottom portion 121 which becomes a reference of angles. In addition, for the convenience of description, the angle α of the inclined surface is illustrated based on a first virtual line L1 which is parallel to the main crucible bottom portion 121.

In an exemplary embodiment of the present invention, a connection portion 123*c* where the inclined surface 123*a* is connected to the main crucible side portion 122, that is, the corner portion is formed as a curved surface. Accordingly, when the molten silicon M flows down along the inclined surface 123*a*, the splashing is prevented even while it passes through the connecting portion 123*c*.

In an exemplary embodiment of the present invention, the total height HT of the main crucible 120 is the sum of a height H1 of the main crucible bottom portion 121, a height H2 of the main crucible side portion 122 and a height H3 of the crucible inclined portion 123. For example, when the slope of the main crucible inclined portion 123 is 45°, the thickness of the susceptor 130 (refer to FIG. 1) is the same as the height H3 of the main crucible inclined portion 123. In addition, the thickness of the susceptor 130 (refer to FIG. 1) may be less than 25 mm. In addition, the total height HT of the main crucible 120 may be approximately 132 mm. In this case, the height H3 of the main crucible inclined portion 123 may be within about 20% of the total height HT of the main crucible 120.

The main crucible 120 according to an exemplary embodiment of the present invention may be formed in a shape that is not high in height compared to the width of the main crucible 120, and when it is poured into the inclined portion 123 in order to allow molten silicon to flow into the main crucible 120, the inclined portion 123 of the main crucible 120 is preferably formed to have a certain extension length in order to flow down along the inclined portion 123 and stably flow into the main crucible 120 through the main crucible side portion. As such, since the inclined portion 123 of the main crucible 120 has a certain extension length, even if the molten silicon M is poured into an inclined surface while the main crucible 120 is rotated, it is prevented from splashing around the main crucible 120.

Meanwhile, the susceptor 130 is formed to surround the outer surfaces of the main crucible bottom portion 121, the main crucible side portion 122 and the main crucible inclined portion 123. In addition, the upper end of the susceptor 130 is formed to be inclined to support the main crucible inclined portion 123. Accordingly, the main crucible inclined portion 123 may be heated by the susceptor 130. For example, the cross-section of the upper end of the susceptor 130 may be approximately formed in an inverted triangle.

In addition, the upper end surface 131 of the susceptor 130 is formed to be inclined at a second angle β which is formed with the main crucible bottom portion 121. Herein, the second angle β is illustrated based on a second virtual line L2 which is parallel to the main crucible bottom portion 121. In addition, when the second angle β is the same as the angle α, the upper end surface 131 of the susceptor 130 stably supports the main crucible inclined portion 123 if the main crucible inclined portion 123 is deformed by high temperature.

In addition, the length T3 of the inclined surface 123*a* is longer than the sum (T1+T2) of the thickness T1 of the main crucible 120 and the thickness T2 of the susceptor 130. Accordingly, the molten silicon M is prevented from moving to the susceptor 130 away from the inclined surface 123*a*.

In addition, the preliminary crucible 180 includes a melting part 181 in which the solid silicon material is melted, and a protrusion part 182 which extends from the melting part in the direction of the main crucible such that the molten silicon is supplied from the melting part 181 along the inclined surface 123*a* of the main crucible 120 to the inside of the main crucible 120.

The protrusion part 182 is provided with a guide surface 182*a* for guiding the molten silicon in the direction of the main crucible 120.

In an exemplary embodiment of the present invention, the preliminary crucible 180 is moved so as to be located at a first position in which the solid silicon material is melted, and at a second position in a state for supplying the molten silicon to the main crucible 120.

In the first position, as illustrated in FIG. 1, the guide surface 182*a* is formed inclined in the upper direction of the main crucible 120. In addition, the angle θ1 between the guide surface 182*a* and the main crucible bottom portion 121 at the first position corresponds to an acute angle range. For example, the angle θ1 between the guide surface 182*a* and the main crucible bottom portion 121 at the first position may be approximately 7°.

Further, in the second position, the angle θ2 between the guide surface 182*a* and the main crucible bottom portion 121 is equal to or greater than 0°. Herein, the angle θ2 between the guide surface 182a and the main crucible bottom portion 121 is illustrated based on a third virtual line L3 which is parallel to the main crucible bottom portion 121. If the angle θ2 between the guide surface 182a and the main crucible bottom portion 121 in the second position is too large, the molten silicon M is rapidly poured toward the main crucible, and thus, there is an increased possibility of splashing around while pouring. Therefore, by adjusting the angle θ2 between the guide surface 182a and the main crucible bottom portion 121 to control the speed at which the molten silicon M is poured, the molten silicon M is prevented from splashing while being poured toward the main crucible.

In this case, in an exemplary embodiment of the present invention, the angle θ2 between the guide surface 182a and the main crucible bottom portion 121 at the second position is smaller than the angle between the inclined surface 123a and the main crucible bottom portion 121.

Further, in the second position, the end of the protrusion part 182 is positioned to be adjacent to the inclined surface 123a, and in the first position, the end of the protrusion part 182 is positioned farther from the inclined surface 123a compared to the second position.

Accordingly, when the molten silicon M accommodated in the preliminary crucible 180 falls toward the inclined surface 123a while the end of the protrusion part 182 is positioned to be adjacent to the inclined surface 123a, the molten silicon M falls in an acute angle range with respect to the inclined surface 123a such that the molten silicon M is prevented from colliding with the inclined surface 123a and splashing.

As such, according to an exemplary embodiment of the present invention, since the molten silicon M of the preliminary crucible 180 is supplied to the inside of the main crucible 120 via the inclined surface 123a, the molten silicon M of the preliminary crucible 180 is not directly supplied to the main crucible 120, thereby preventing the splashing of the molten silicon M into the main crucible 120.

In addition, since the molten silicon M of the preliminary crucible 180 is supplied to the main crucible 120 at a maximum distance from the first region 21, a sudden change in temperature of the first region 21 is prevented by supplying the molten silicon M of the preliminary crucible 180.

In addition, referring to FIG. 3, the upper end 123b of the main crucible inclined portion 123 is disposed between a virtual line L4 and rotation radii C1, C2 of the preliminary crucible 180. Herein, the virtual line L4 is a line extending from the end of the protrusion part 182 in the Z-axis direction. Accordingly, as the upper end 123b of the main crucible inclined portion 123 is disposed between the virtual line L4 and the rotation radii C1, C2 of the preliminary crucible 180, the molten silicon M is prevented from leaking out of the main crucible 120 in the process of supplying molten silicon from the preliminary crucible 180 to the inclined surface 123a.

FIG. 4 is a view showing a main crucible of the apparatus for growing an ingot according to another exemplary embodiment of the present invention.

Referring to FIG. 4, the main crucible 220 of the apparatus for growing an ingot according to another exemplary embodiment of the present invention has a substantially conical shape. For example, the bottom 221 of the main crucible 220 is formed to protrude. In addition, the inclined surface 220a of the main crucible 220 is formed to have a constant angle a1 which is formed with the upper direction of the bottom 221.

In this way, the main crucible 220 of the apparatus for growing an ingot according to another exemplary embodiment of the present invention has a wider inclined surface 220a than that in the exemplary embodiment of the present invention, so as to be stably supplied with the silicon molten product of the preliminary crucible 180 (refer to FIG. 3).

FIG. 5 is a view showing a main crucible of the apparatus for growing an ingot according to another exemplary embodiment of the present invention.

Referring to FIG. 5, the main crucible 320 of the apparatus for growing an ingot according to another exemplary embodiment of the present invention is formed with an inclined surface 320a having a rounded shape.

Accordingly, when the water level of the molten silicon (M) accommodated in the main crucible 320 is lowered, it has a wider inclined surface 320a than that in the embodiment of the present invention, so as to be stably supplied with the silicon molten product of the preliminary crucible 180 (refer to FIG. 3).

FIG. 6 is a view showing a main crucible of the apparatus for growing an ingot according to another exemplary embodiment of the present invention.

Referring to FIG. 6, the main crucible 420 of the apparatus for growing an ingot according to another exemplary embodiment of the present invention has a substantially cylindrical shape. The main crucible 420 includes a bottom portion 421, a side portion 422 and a protruding guide portion 423.

The bottom portion 421 has a rounded shape.

The side portion 422 extends upwardly from the bottom portion 421.

The inner surface 422a of the side portion 422 may be in contact with the molten silicon M.

The protruding guide portion 423 is formed to protrude from the upper end of the side portion 422 in the inner direction of the main crucible 420. The side surface 423a of the protruding guide portion 423 has an inwardly rounded shape.

The main crucible 420 has a substantially cylindrical shape, and is formed to have a larger volume for accommodating the molten silicon (M) compared to the main crucibles having other shapes. Accordingly, the main crucible 420 accommodates the molten silicon (M) having a higher water level than the main crucible of the above-described exemplary embodiment.

In addition, after the molten silicon M accommodated in the preliminary crucible 180 (refer to FIG. 3) falls on the upper surface 423b of the protruding guide portion 423, it flows down along the side surface 423a of the protruding guide portion 423. Accordingly, the molten silicon (M) is prevented from splashing into the inner side of the main crucible 420.

FIG. 7 is a perspective view showing a main crucible of the apparatus for growing an ingot according to another exemplary embodiment of the present invention, and FIG. 8 is a view of the main crucible of FIG. 7 viewed from the upper side of the main crucible.

Referring to FIGS. 7 and 8, the main crucible 520 of the apparatus for growing an ingot according to another exemplary embodiment of the present invention includes a main crucible bottom 521, a main crucible side portion 522 and a main crucible inclined portion 523, and when the components of another exemplary embodiment of the present invention are the same as or similar to those of the exemplary embodiment of the present invention, the above descriptions will be substituted.

The main crucible inclined portion 523 is provided with a guide groove 525 which is formed on the inclined surface 523a to guide the molten silicon supplied onto the inclined surface 523a.

A plurality of guide grooves 525 are formed on the inclined surface 523a along the circumferential direction of the main crucible 520. In addition, the guide groove 525 is formed in a spiral shape which is bent from the inside to the outside on the inclined surface 523a.

In addition, when the main crucible 520 rotates in a counterclockwise direction C2, the molten silicon which is accommodated in the main crucible 520 is also rotated in the counterclockwise direction C2. That is, the molten silicon is moved in the counterclockwise direction C2 in a region which is adjacent to the main crucible inclined portion 523.

In this case, the molten silicon of the preliminary crucible 180 (refer to FIG. 3) moves along the guide groove 525, and is not directly supplied to the first region 21 of the main crucible 520, but it is supplied to the second region 22 rotating in the counterclockwise direction C2. That is, the guide groove 525 prevents the molten silicon from being directly supplied to the first region 21, thereby improving the yield of single crystals of the ingot from being lowered. In this case, the width of the guide grooves 525, the number, depth and degree of bending of the guide grooves 525 may be designed in various ways in order to prevent splashing of the poured molten silicon. In addition, although the present exemplary embodiment is exemplified so that the guide groove 525 is used to guide the molten silicon, it may be also possible that a guide protrusion rather than a guide groove is formed in the inclined portion.

Although the exemplary embodiments of the present invention have been described, the spirit of the present invention is not limited by the exemplary embodiments presented herein, and a person skilled in the art who understands the spirit of the present invention may easily suggest other exemplary embodiments by modifying, changing, deleting or adding components within the scope of the same spirit, but this will also be within the spirit of the present invention.

The invention claimed is:

1. An apparatus for growing an ingot, comprising:
a growth furnace for growing the ingot; and
a main crucible which is accommodated in the growth furnace and accommodates molten silicon,
wherein the main crucible comprises:
a main crucible bottom portion;
a main crucible side portion which extends upwardly from the main crucible bottom portion; and
a main crucible inclined portion that has an inclined surface extending upward and outward from the main crucible side portion, and
wherein when the molten silicon is supplied from an upper side of the main crucible side portion into the main crucible, the molten silicon is guided into the main crucible along the inclined surface,
wherein a guide groove is formed on the inclined surface of the main crucible inclined portion, the guide groove guiding molten silicon supplied onto the inclined surface and being formed in a curved shape extending from an inner side toward an outer side on the inclined surface, and
wherein an inside of the main crucible is divided into a first region in which the ingot is grown and a second region surrounding the first region, and the molten silicon moves along the guide groove and is guided to the second region of the main crucible.

2. The apparatus of claim 1, wherein the inclined surface is formed such that an angle of the inclined surface with respect to the main crucible bottom portion is constant from an inner side to an outer side of the main crucible, or the angle gradually decreases from the inner side to the outer side.

3. The apparatus of claim 1, wherein the main crucible side portion is formed perpendicularly or inclined outward from the main crucible bottom portion.

4. The apparatus of claim 1, wherein a connecting portion where the inclined surface is connected to the main crucible side portion is formed as a curved surface.

5. The apparatus of claim 1, wherein the guide groove is formed in plurality on the inclined surface along a circumferential direction of the main crucible.

6. The apparatus of claim 1, further comprising:
a susceptor which is formed to surround outer surfaces of the main crucible bottom portion, the main crucible side portion and the main crucible inclined portion; and
a heater which is located outside the susceptor to heat the main crucible by heating the susceptor.

7. The apparatus of claim 1, further comprising:
a preliminary crucible for melting a solid silicon material to produce the molten silicon and supplying the molten silicon to the main crucible,
wherein the preliminary crucible comprises:
a melting part in which the solid silicon material is melted; and
a protrusion part which is provided with a guide surface extending from the melting part toward the main crucible to guide the molten silicon toward the main crucible such that the silicon melted from the melting part can be supplied into the main crucible along the inclined surface of the main crucible, and
wherein the preliminary crucible is movable so as to be located at a first position in which the solid silicon material is melted and at a second position in which the molten silicon is supplied to the main crucible.

8. The apparatus of claim 7, wherein in the first position, the guide surface is formed to be inclined in an upward direction of the main crucible.

9. The apparatus of claim 7, wherein in the second position, an angle between the guide surface and the main crucible bottom portion is smaller than the angle between the inclined surface and the main crucible bottom portion.

10. The apparatus of claim 7, wherein in the second position, an end of the protrusion part is positioned adjacent to the inclined surface, and in the first position, the end of the protrusion part is positioned farther from the inclined surface than in the second position.

* * * * *